US006979872B2

(12) United States Patent
Borwick, III et al.

(10) Patent No.: US 6,979,872 B2
(45) Date of Patent: Dec. 27, 2005

(54) MODULES INTEGRATING MEMS DEVICES WITH PRE-PROCESSED ELECTRONIC CIRCUITRY, AND METHODS FOR FABRICATING SUCH MODULES

(75) Inventors: Robert L. Borwick, III, Thousand Oaks, CA (US); Jeffrey F. DeNatale, Thousand Oaks, CA (US); Robert J. Anderson, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 149 days.

(21) Appl. No.: 10/438,512

(22) Filed: May 13, 2003

(65) Prior Publication Data

US 2004/0227201 A1 Nov. 18, 2004

(51) Int. Cl.[7] ........ H01L 29/84
(52) U.S. Cl. ........ 257/415
(58) Field of Search ........ 257/414, 415

(56) References Cited

U.S. PATENT DOCUMENTS 4,874,499 A * 10/1989 Smith et al. ........ 204/403.03
5,578,976 A 11/1996 Yao ........ 333/262
5,880,921 A 3/1999 Tham et al. ........ 361/233
5,959,516 A 9/1999 Chang et al. ........ 334/14
6,074,890 A 6/2000 Yao et al. ........ 438/52
6,159,385 A 12/2000 Yao et al. ........ 216/2
6,188,322 B1 2/2001 Yao et al. ........ 340/664
6,199,874 B1 3/2001 Galvin et al. ........ 280/5.514
6,275,122 B1 8/2001 Speidell et al. ........ 333/186
6,277,666 B1 8/2001 Hays et al. ........ 438/50
6,348,788 B1 2/2002 Yao et al. ........ 324/99 R
6,411,214 B1 6/2002 Yao et al. ........ 340/664
6,417,743 B1 7/2002 Mihailovich et al. ........ 333/24 C
6,423,815 B1 * 7/2002 Nakajima et al. ........ 528/288
2003/0174934 A1 * 9/2003 Ishii et al. ........ 385/18
2004/0016995 A1 * 1/2004 Kuo et al. ........ 257/678
2004/0063237 A1 * 4/2004 Yun et al. ........ 438/48
2004/0076366 A1 * 4/2004 Yun et al. ........ 385/18
2004/0112529 A1 * 6/2004 Karlsson et al. ........ 156/306.6

OTHER PUBLICATIONS

M. Heschel et al., "Stacking Technology for A Space Constrained Microsystem", IEEE, 11th Annual International Workshop on Micro Electrical Mechanical Systems, Jan. 25-29, 1998, pp. 312-317.*

Merriam-Webster's Collegiate Dictionary, 10ed., 2001, pp. 817.*

* cited by examiner

*Primary Examiner*—W. David Coleman
(74) *Attorney, Agent, or Firm*—Koppel, Jacobs, Patrick & Heybl

(57) ABSTRACT

A MEMS module is provided comprising at least one MEMS device adhesively bonded to a substrate or wafer, such as a CMOS die, carrying pre-processed electronic circuitry. The at least one MEMS device, which may comprise a sensor or an actuator, may thus be integrated with related control, readout/signal conditioning, and/or signal processing circuitry.

An example of a method pursuant to the invention comprises the adhesive bonding of a pre-processed electronics substrate or wafer to a layered structure preferably in the form of a silicon-on-insulator (SOI) substrate. The SOI is then bulk micromachined to selectively remove portions thereof to define the MEMS device. Prior to release of the MEMS device, the device and the associated electronic circuitry are electrically interconnected, for example, by wire bonds or metallized vias.

13 Claims, 5 Drawing Sheets

MODULES INTEGRATING MEMS DEVICES WITH PRE-PROCESSED ELECTRONIC CIRCUITRY, AND METHODS FOR FABRICATING SUCH MODULES

BACKGROUND OF THE INVENTION

1. Field of the Invention

The present invention relates generally to microelectromechanical systems (MEMS) and particularly to composite structures or modules integrating at least one MEMS device with a substrate carrying pre-processed electronic circuitry. The invention further relates to methods for fabricating such modules.

2. Description of the Related Art

MEMS devices comprise a class of very small electromechanical devices that combine many of the most desirable aspects of conventional mechanical and solid-state devices while also providing both low insertion losses and high electrical isolation. Unlike a conventional electromechanical device, a MEMS device can be combined with related electronic circuitry. Presently, this is accomplished either by combining the MEMS device and the circuitry in the form of a multi-chip module (MCM) or by monolithically integrating the two. Both have drawbacks. For example, MCM results in large footprints and inferior performance and, although monolithic integration provides reduced size and improved performance, it typically involves extensive compromises in both circuit and MEMS device processing.

U.S. Pat. No. 6,159,385 issued Dec. 12, 2000, and owned by the assignee of the present invention, discloses a low temperature method using an adhesive to bond a MEMS device to an insulating substrate comprising glass or plain silicon. Among other advantages, adhesive bonding avoids the high temperatures associated with processes such as anodic and fusion bonding.

SUMMARY OF THE INVENTION

The present invention provides a versatile, compact, low-cost module integrating at least one MEMS device with related electronic circuitry, and a method for making such a module. The invention exploits the low temperature MEMS fabrication process disclosed in U.S. Pat. No. 6,159,385 that is incorporated herein by reference in its entirety.

Broadly, the present invention provides a MEMS module comprising at least one MEMS device adhesively bonded to a substrate or wafer carrying pre-processed electronic circuitry. The at least one MEMS device, which may comprise a sensor or an actuator, may thus be integrated with related control, readout/signal conditioning, and/or signal processing circuitry.

In accordance with one specific, exemplary embodiment of the invention, there is provided a MEMS module comprising at least one MEMS device including a movable element; a substrate having a surface carrying electronic circuitry, the at least one MEMS device overlying at least a portion of the electronic circuitry; an organic adhesive bond joining the at least one MEMS device and the circuitry-carrying surface of the substrate; and electrical conductors connecting the at least one MEMS device with the electronic circuitry. Preferably, the at least one MEMS device is formed on a silicon-on-insulator (SOI) substrate.

Pursuant to another, specific, exemplary embodiment of the invention, there is provided a method of fabricating a module integrating at least one MEMS device with electronic circuitry. The method comprises the steps of providing a first substrate including a surface having the electronic circuitry formed thereon; using an adhesive polymer, bonding the surface of the first substrate to a surface of a second substrate, the surface of the second substrate overlying the electronic circuitry; selectively etching a portion of the second substrate to define the at least one MEMS device; selectively etching away a portion of the adhesive polymer to release at least one movable element of the at least one MEMS device, the at least one MEMS device being supported and coupled to the first substrate by at least a part of the remaining adhesive polymer; and electrically interconnecting the at least one MEMS device with the electronic circuitry on the first substrate.

BRIEF DESCRIPTION OF THE DRAWINGS

The foregoing and other objects, features and advantages of the invention will be apparent to those skilled in the art from the following detailed description of the preferred embodiments when taken together with the accompanying drawings, in which.

DETAILED DESCRIPTION OF THE INVENTION

The following description presents preferred embodiments of the invention representing the best mode contemplated for practicing the invention. This description is not to be taken in a limiting sense but is made merely for the purpose of describing the general principles of the invention whose scope is defined by the appended claims.

Figure 1:
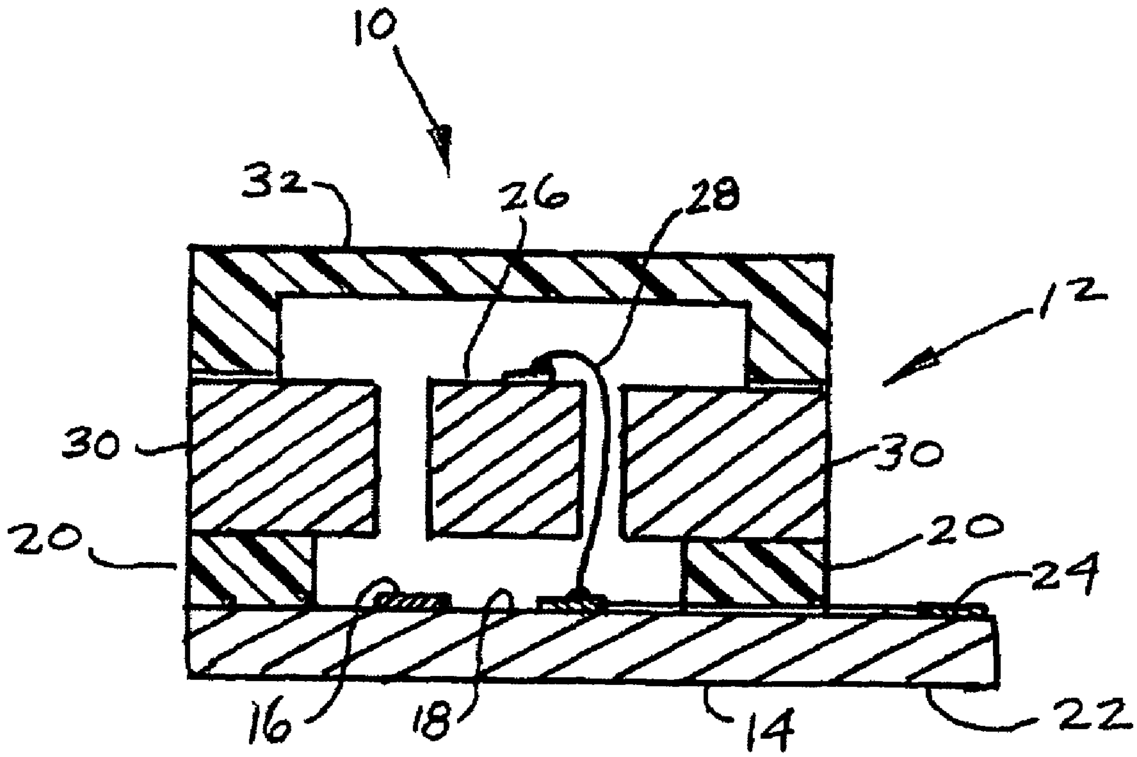
FIG. 1 is a side elevation view, in cross section, showing in schematic form a module in accordance with one embodiment of the invention comprising a MEMS device adhesively bonded to an associated substrate carrying electronic circuitry.

FIG. 1 illustrates, in schematic form, a module 10 in accordance with one embodiment of the present invention. The module 10 integrates a single MEMS device 12 with a substrate or wafer 14 carrying pre-processed electronic circuitry, shown schematically as a block 16, occupying an area on an upper surface 18 of the wafer 14. The electronics wafer 14 may be in the form of, by way of example, a CMOS die, and the pre-processed circuitry may comprise control, readout/signal conditioning, and/or signal processing circuitry. The MEMS device 12 is attached to the upper surface of the electronics wafer 14 by means of an adhesive bonding agent 20, and for compactness overlies at least in part, and preferably in its entirety, the area of the substrate occupied by the electronic circuitry 16.

The electronics wafer 14 includes an extension 22 projecting beyond the confines of the MEMS device 12. The extension 22 carries pads or contacts 24 electrically connected to the circuitry 16.

The MEMS device 12 may comprise any one of a variety of MEMS sensors and actuators including, without limitation, current sensors, accelerometers, gyros, magnetic sensors, electro-optical actuators, electrical switches, pressure transducers, capacitors and electromechanical motors.

In the specific example of FIG. 1, the MEMS device comprises a movable element 26 disposed between a pair of stationary elements 28. It will be understood that the movable MEMS element 26 may take various forms depending upon the intended application, for example, a cantilever anchored at one end or a deflectable beam suspended between fixed ends. For example, the movable MEMS element 26 could comprise the measurement beam of a MEMS current sensor such as that disclosed in U.S. Pat. No. 6,188,322 issued Feb. 13, 2001.

Electrically conductive connection layers 30 and 32 overlie the movable and stationary elements 26 and 28, respectively. The layer 30 on the movable element 26 also overlies the fixed anchor or end(s) of the element 26. The conductive layers 30 and 32 are electrically coupled to the electronic circuitry 16 on the wafer 14 by means of conductive vias (not shown) extending through the stationary elements 28 and through the fixed anchor or ends of the movable element 26. Alternatively, the conductive layers may be coupled to the electronic circuitry 16 on the wafer 14 by wire bonds, such as the representative wire bond 34 electrically connecting the conductive layer 32 with a pad 36 on the wafer 14. Instead of, or in addition to, the electrically conductive layers 30 and 32, the upper surfaces of the elements of the MEMS device may carry one or more insulating layers and/or electronic circuitry.

The module further preferably comprises a protective cap or cover 38 appropriately bonded to the top of the MEMS device.

FIGS. 2 through 8 show, in cross-section, the steps for fabricating a module integrating a single MEMS device with a pre-processed electronics wafer, such as, for example, a CMOS die, upon which electronic circuitry has been formed by conventional microcircuitry fabrication techniques. As already noted, the pre-processed circuitry may comprise, by way of example, control, readout/signal conditioning, and/or signal processing circuitry. The process steps shown and described herein are intended to be generic, being applicable generally to the fabrication of any bulk micromachined MEMS device such as any of those mentioned earlier. Generally, the process exploits the low-temperature nature of the adhesive MEMS process of incorporated U.S. Pat. No. 6,159,385 for compatibility with pre-processed silicon circuitry.

Figure 2:
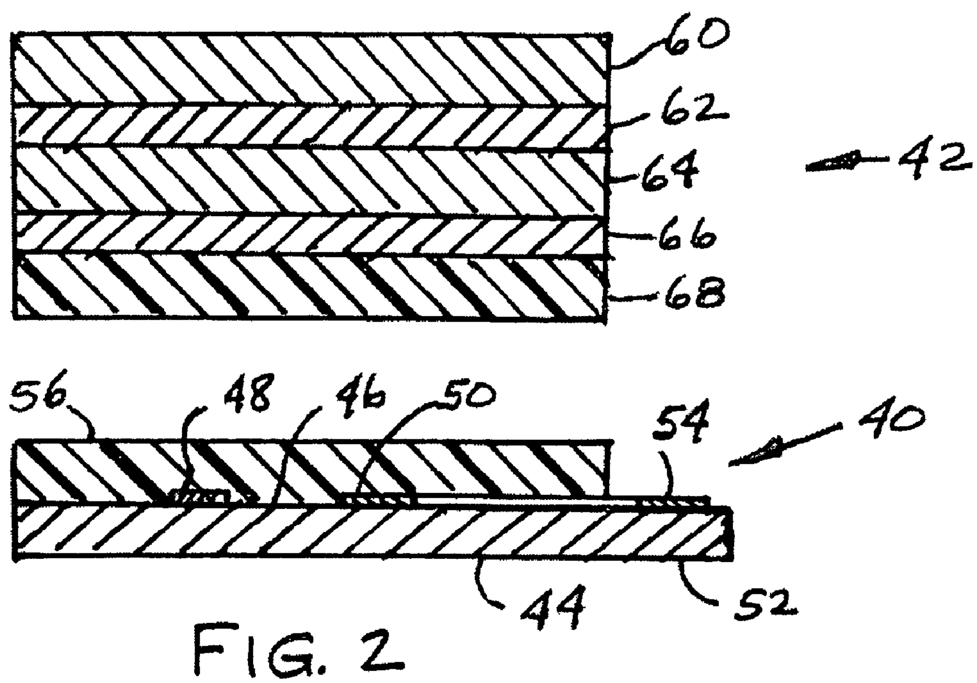
FIG. 2 is a side elevation view, in cross section, of first and second, multi-layer structures which, when combined and processed in accordance with the invention, form an integrated module such as that shown schematically in FIG. 1.

More specifically, with reference to FIG. 2, there is shown a pair of layered structures 40 and 42 from which the integrated MEMS and circuit module is fabricated. The first or lower structure 40 includes an electronics wafer 44 having an upper surface 46 and a lower surface 47. The upper surface 46 carries electronic circuitry represented by a block 48 and electrically conductive interconnections between the circuit elements. As noted, the electronic circuit elements and their interconnections are formed using conventional microfabrication techniques. The electronic elements may include, without limitation, resistors, inductors, capacitors, transistors, and the like. Further, by way of example, the electronics wafer may comprise a CMOS die. Internal wire bond pads, such as the pad 50, may be formed on the electronics wafer 44 for electrically coupling the circuit elements 48 with the MEMS device to be formed. The wafer 44 may include a margin 52 that in the final device will define an edge connector or extension carrying external signal, power and ground pads, collectively represented by the pad 54, electrically connected to the electronic circuitry 48 by means of conductive paths electrically formed on the wafer.

Alignment marks 55 precisely positioned relative to the circuit elements 48 are formed in the upper surface 46 of the wafer 44. Alignment marks 56 corresponding to the marks 55 and in precise vertical alignment therewith, are formed in the lower surface 47 of the wafer 44.

An organic adhesive 58, further described below, is deposited on the upper surface of the wafer 44. Spin coating provides the most practical method for application of the organic adhesive although other coating techniques, such as spray coating or the staged deposition of partially cured thin films, may also be used.

The second or upper layered structure 42 comprises a top silicon layer 60 on a thin insulating layer 62 typically having a thickness of 0.25 $\mu$m–2 $\mu$m. The insulating layer 62 preferably comprises silicon dioxide but, alternatively, may be formed of silicon nitride, aluminum oxide, silicon oxynitride, silicon carbide, or the like. The insulating layer 62 in turn overlies a silicon layer 64, typically 10 $\mu$m–80 $\mu$m thick, defining a MEMS device layer. The top silicon layer 60, which by way of example may be 400 $\mu$m thick, is preferably either a p-type or an n-type silicon such as is commonly used in semiconductor processing; the orientation and the conductivity of the silicon layer 60 will depend on the specific application. Preferably, the silicon MEMS device layer 64 is doped so as to impart etch stop and/or semiconductor properties. The silicon layer 60 comprises a handle layer and this layer, together with the insulating layer 62, serves as a sacrificial platform for the MEMS device layer 64.

Preferably, the three layers 60, 62 and 64 comprise a silicon-on-insulator (SOI) substrate or wafer commercially available from various suppliers such as Shin-Etsu Handotai Co., Ltd., Japan. Such a substrate, in its commercial form, comprises a buried layer of insulating material, typically silicon dioxide, sandwiched between layers of silicon one of which serves as the handle layer and the other of which comprises the device layer. SOI substrates are commercially available having various silicon layer thicknesses and thus may be selected to match the height of the final MEMS device.

An optional insulating layer 66 of, for example, silicon dioxide, silicon nitride, aluminum oxide, silicon oxynitride, silicon carbide, or the like, may be grown or deposited on the bottom surface of the silicon MEMS device layer 64. In addition, an optional metal layer of aluminum or the like (not shown) may be deposited on the insulating layer 66. An organic adhesive 68 is spin coated or otherwise deposited over the MEMS device 64 layer, or over the silicon dioxide and metal layers, if either or both of these are present.

The term "organic adhesive" refers to thermosetting plastics in which a chemical reaction occurs. The chemical reaction increases rigidity as well as creating a chemical bond with the surfaces being mated.

While epoxy is the most versatile type of organic adhesive for the present invention, other potential adhesives include polyimides, silicones, acrylics, polyurethanes, polybenzimidazoles, polyquinoralines and benzocyclobutene (BCB). Other types of organic adhesives such as thermoplastics, which require heating above their melting point like wax, although usable would be of less value for this application. The selection of the adhesive depends in large part on the polymer's thermal characteristics and particularly its glass transition temperature. Other selection criteria include economics, adhesive strength on different substrates, cure shrinkage, environmental compatibility and coefficient of thermal expansion.

The glass transition temperature is the temperature at which chemical bonds can freely rotate around the central polymer chain. As a result, below the glass transition temperature, the polymer, when cured, is a rigid glass-like material. Above the glass transition, however, the polymer is a softer, elastomeric material. Further, at the glass transition temperature there is a substantial increase in the coefficient of thermal expansion (CTE). Accordingly, when the glass transition temperature is exceeded, there is an increase in the CTE and there is a relief of stress in the polymer layer.

The adhesive-receiving surfaces of the structures 40 and 42 may be exposed to plasma discharge or etching solutions to improve the bonding of the adhesive to such surfaces. The use of a coupling agent or adhesion promoter such as 3-glycidoxy-propyl-trimethoxy-silane (available from Dow Corning as Z-6040) or other agents having long hydrocarbon chains to which the adhesive may bond may be used to improve coating consistency. Wetting agents may be used to improve coating uniformity. However, in most cases, the coupling agent may serve the dual purposes of surface wetting and surface modification. Advantageously, with the use of organic adhesives, surface finish is not overly critical and the surface need not be smooth.

Figure 3:
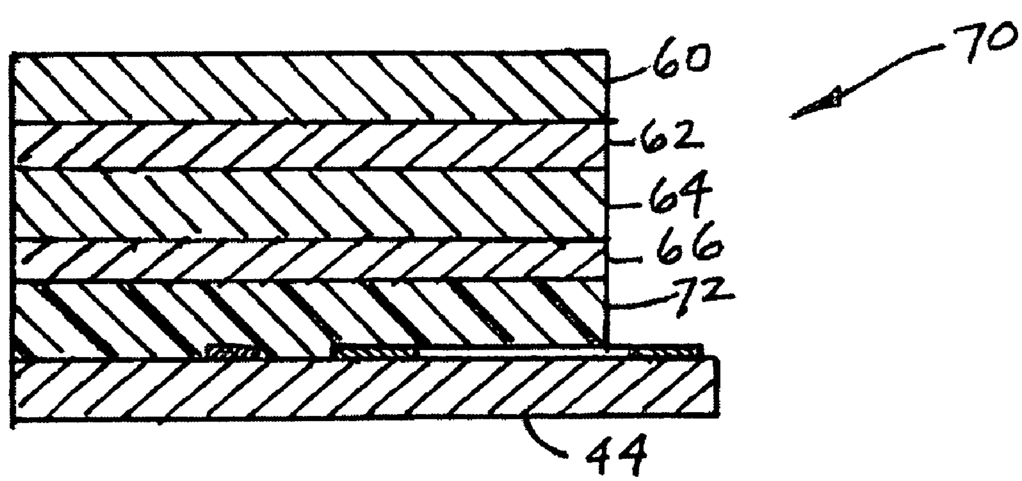
FIG. 3 is a side elevation view, in cross section, of the structures of FIG. 2, adhesively bonded together to form a composite structure.
Figure 4:
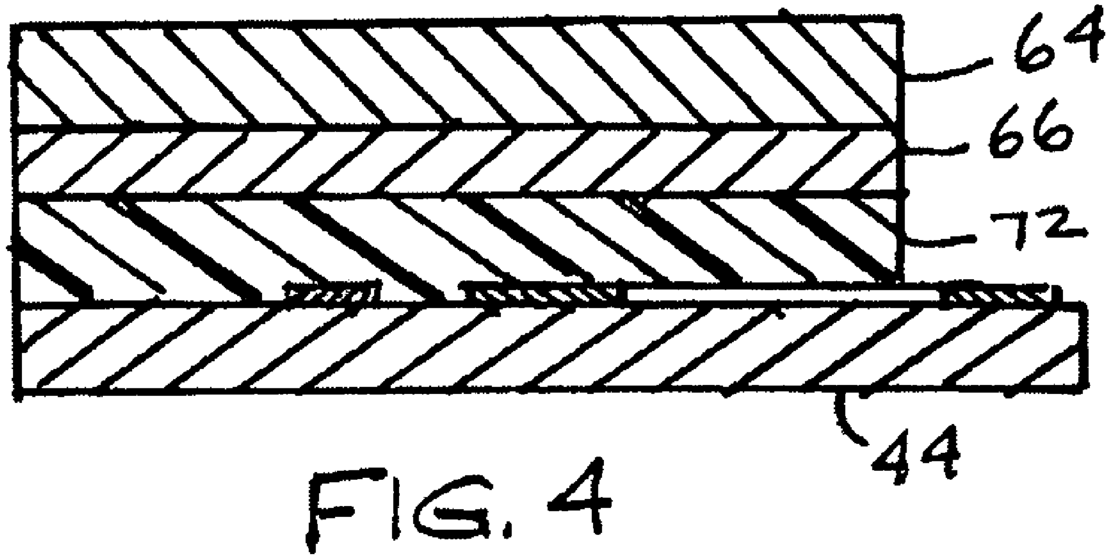
FIG. 4 is a side elevation view, in cross section, of the composite structure of FIG. 3 after removal of the upper layers of the structure.

The first and second structures 40 and 42 are positioned in a vacuum chamber (not shown) with the adhesive layers 58 and 68 in confronting relationship. The chamber is evacuated to remove air that could be trapped between the first and second structures 40 and 42 during the mating process. Once a vacuum is achieved, the first and second structures are aligned and physically joined with adhesive to form a composite structure 70 (FIG. 3). More specifically, as shown in FIG. 3, the adhesive layers 58 and 68 combine to form a single adhesive layer 72 bonding together the two module structures 40 and 42. The adhesive is cured by baking the composite structure for a sequence of oven bakes at elevated temperatures of up to 180° C. to reduce cure shrinkage. As is known, the recommended cure temperatures will depend on the type of adhesive used.

Figure 5:
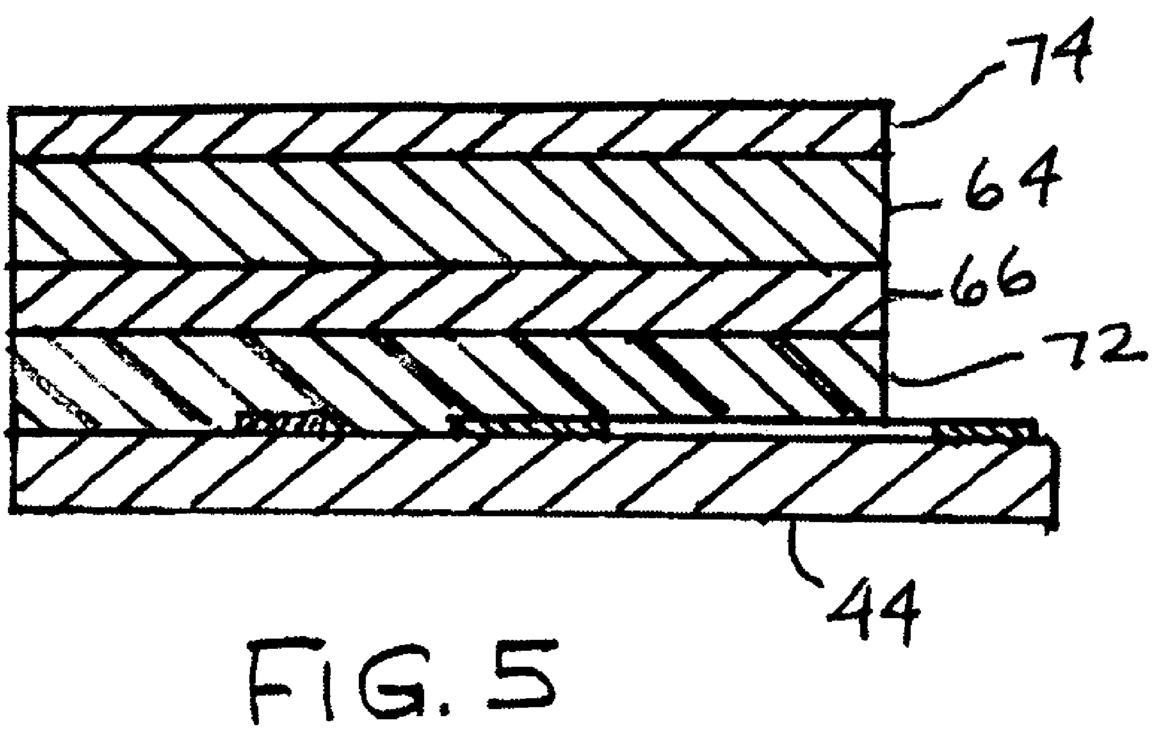
FIG. 5 is a side elevation view, in cross section, of the structure of FIG. 4 after substitution of a metal layer for the removed layers.
Figure 6:
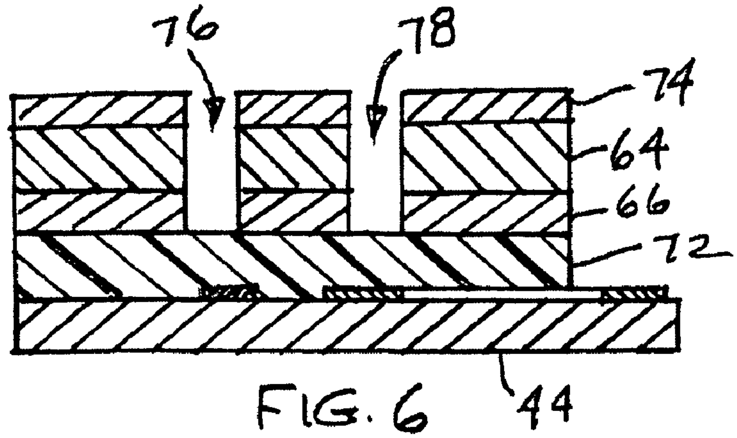
FIG. 6 is a side elevation view, in cross section, of the structure of FIG. 5 following partial etching defining a MEMS device.

The bonding of the structures is followed by a thinning step in which the silicon and silicon dioxide layers 60 and 62 are removed so as to expose an upper surface 73 of the MEMS device layer 64. (FIG. 4) The layers 60 and 62 may be removed using a backside chemical etch. A mechanical grinding or polishing step may precede the chemical etch to reduce the amount of silicon etching required. Alignment marks 74, in precise vertical alignment with the marks 56, are formed in the upper surface 73 of the device layer 64. The removed layers are replaced by an electrically conductive, metal layer 75 having a thickness of about 0.5 to about 3.0 $\mu$m. (FIG. 5). The alignment marks 74 are visible through the thin layer 75.

With the metal layer 75 appropriately masked, selected portions 76, 77 and 78 of the metal, device and insulating layers 75, 64 and 66 are removed by any appropriate, known process, preferably an anisotropic etch performed by deep reactive ion etching (DRIE). (See FIG. 6.) The positions of these deep etches are referenced to the alignment marks 74.

It will be understood by those skilled in the art that in addition to, or instead of, the metal layer 75, one or more insulating layers (formed of the insulating materials previously described) may be deposited on the upper surface 73 of the device layer 64 and patterned. Further, stacked insulating layers alternating with metal layers may be formed on the surface 73, with the metal layers appropriately patterned to define, for example, electrically conductive traces connecting various circuit elements carried by the module. Still further, using known surface micromachining techniques, such layers may be patterned to define a MEMS device such as an electrical switch or other electrical component. In addition, it will be evident that electronic microcircuitry may also be formed on the upper surface 73 of the device layer 64.

Figure 7:
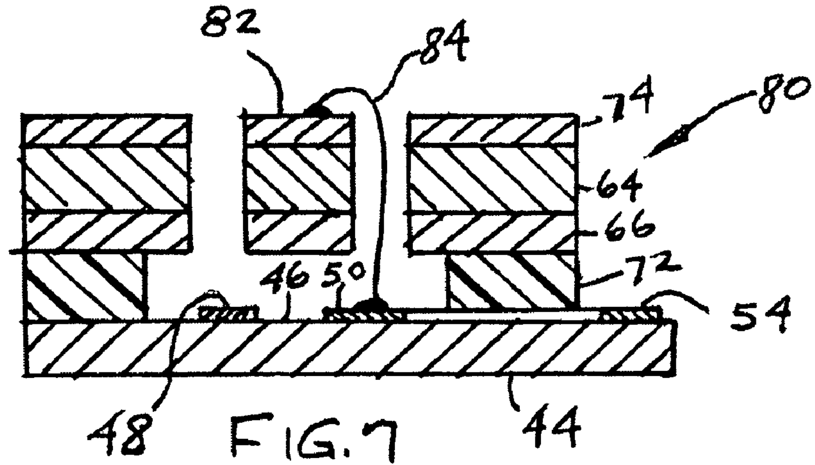
FIG. 7 is a side elevation view, in cross section, of the structure of FIG. 6 following release of the MEMS device.
Figure 8:
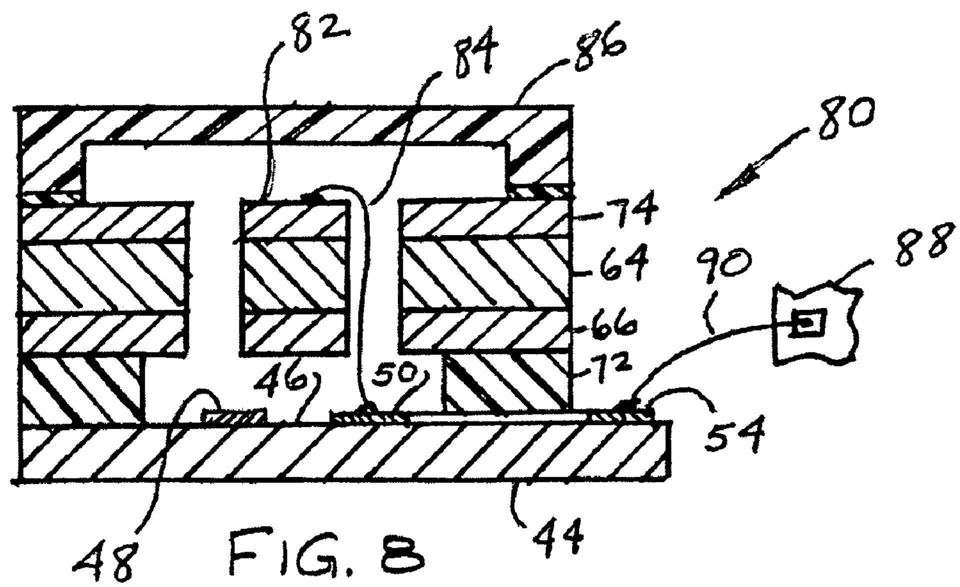
FIG. 8 is a side elevation view, in cross section, of the final integrated module in accordance with the invention.

The adhesive bonding layer 72 is then etched to release the MEMS device 80, that is, to free one or more movable MEMS elements 82. As noted, such movable elements may comprise the displaceable mass of a MEMS accelerometer, the movable plates of a current sensor, and so forth. In a preferred embodiment, an isotropic, dry oxygen plasma etch is applied to undercut the adhesive layer 72. (FIG. 7.) An outer portion of the adhesive layer 72 is simultaneously etched away to expose the electrical pads 54 on the margin 52.

The circuitry 48 on the wafer 44 is then interconnected with the MEMS device 80 by means of plated-through conductive vias or by means of wire bonds 84 (a representative one of which is shown) connected to the internal wire bond pads 50. Both of these bonding techniques (vias and wire bonding) are well known in the art. A protective cap or cover 86 is next bonded to the metal layer 75 to complete the fabrication of the MEMS/electronic circuit module shown in FIG. 8. The module is then ready to be electrically connected to a higher electronic assembly 88 via conductors 90 attached to the external pads 54.

The MEMS device 80 overlies at least a portion of the area, and preferably the entire area, occupied by the electronic circuitry 48 on the wafer 44 so as to form a compact module. This stacked configuration places the MEMS device 80 and the circuitry 48 in close proximity and is made possible by the module fabrication process utilizing low temperature adhesive bonding which does not damage the electronic circuit patterns on the substrate 44. In the absence of this process, the device 80 would have to be bonded to the substrate 44 at a location remote from the region occupied by the electronic circuitry.

Figure 9:
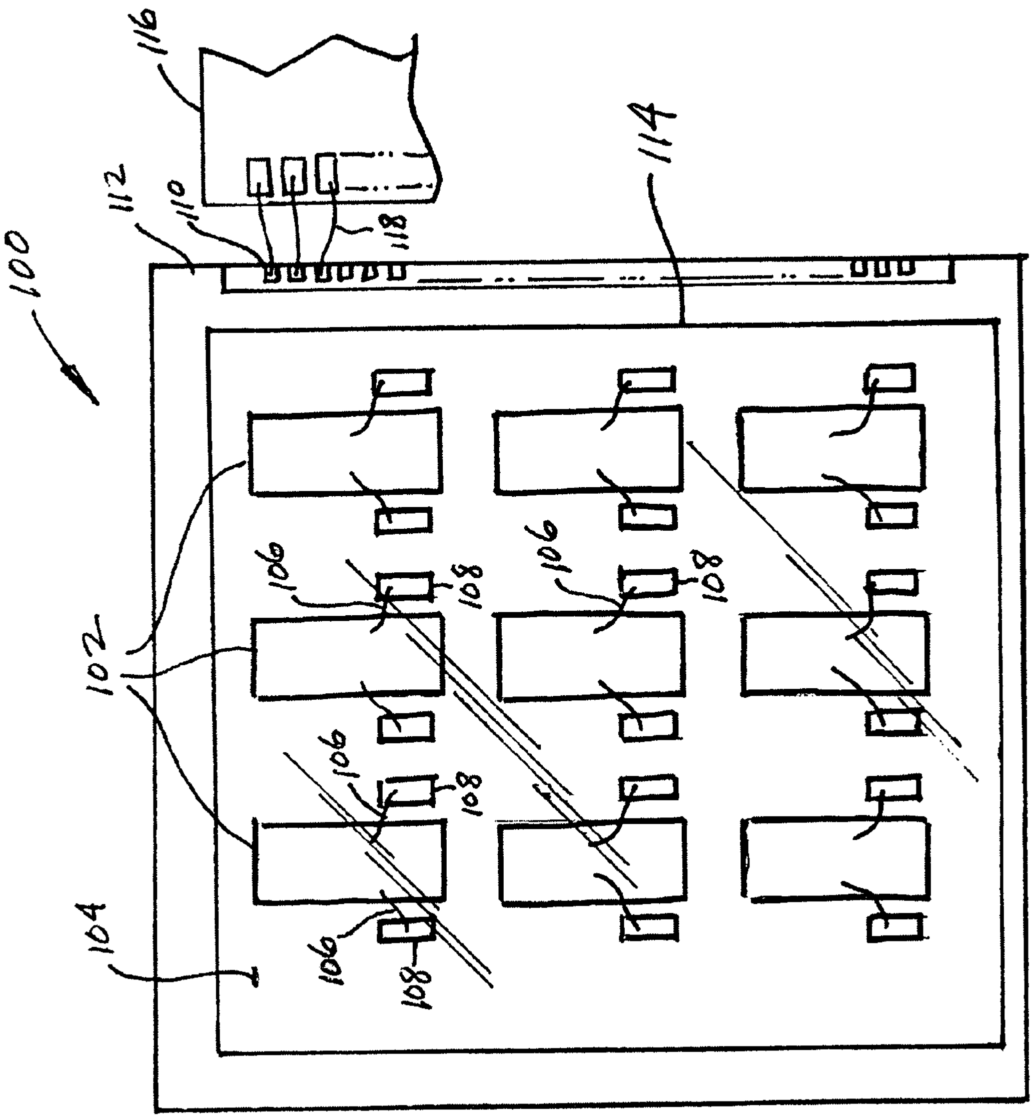
FIG. 9 is a top plan view of a module in accordance with another embodiment of the invention incorporating multiple MEMS devices adhesively bonded to an electronics wafer.
Figure 4:
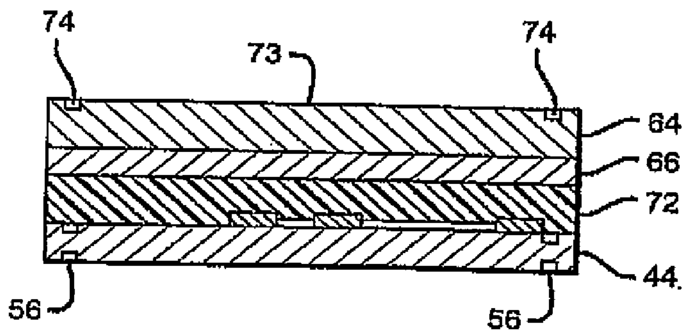
Figure 5:
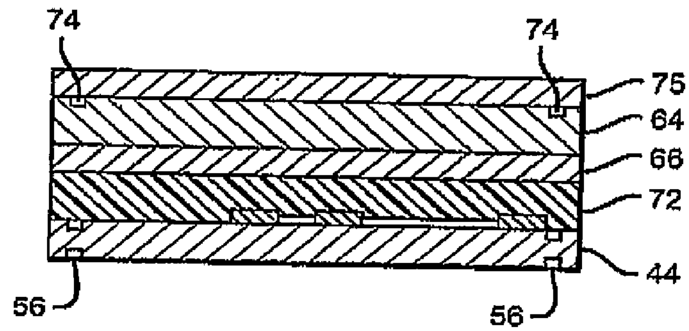
Figure 6:
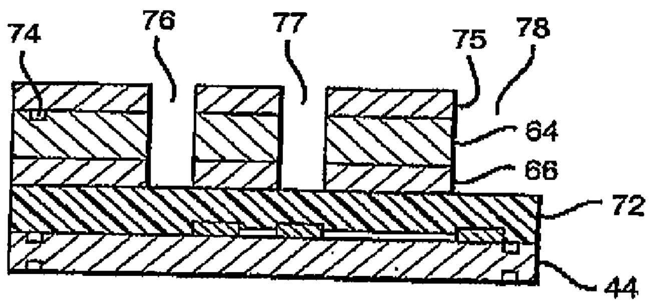
Figure 7:
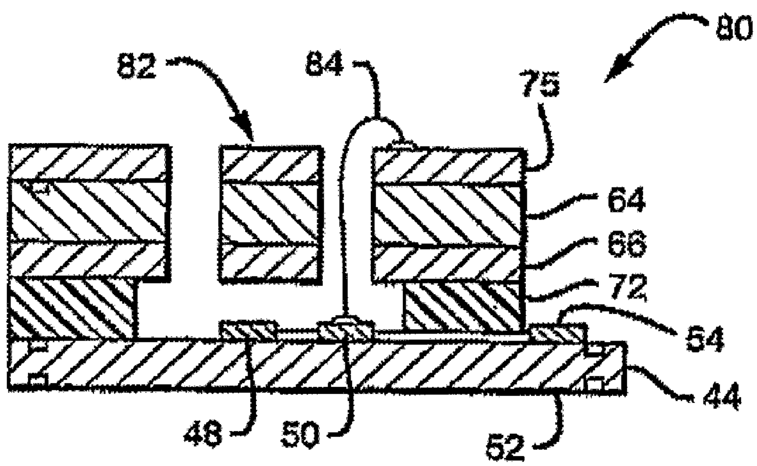
Figure 8:
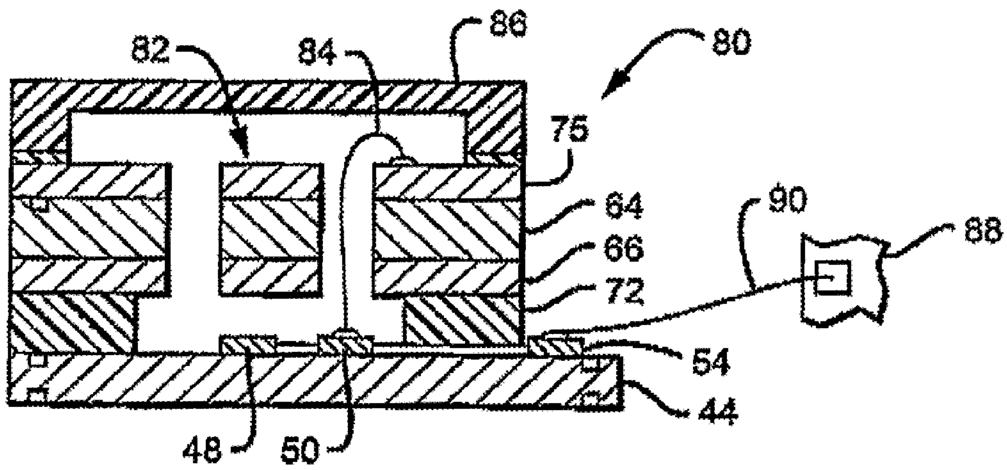
Figure 9:
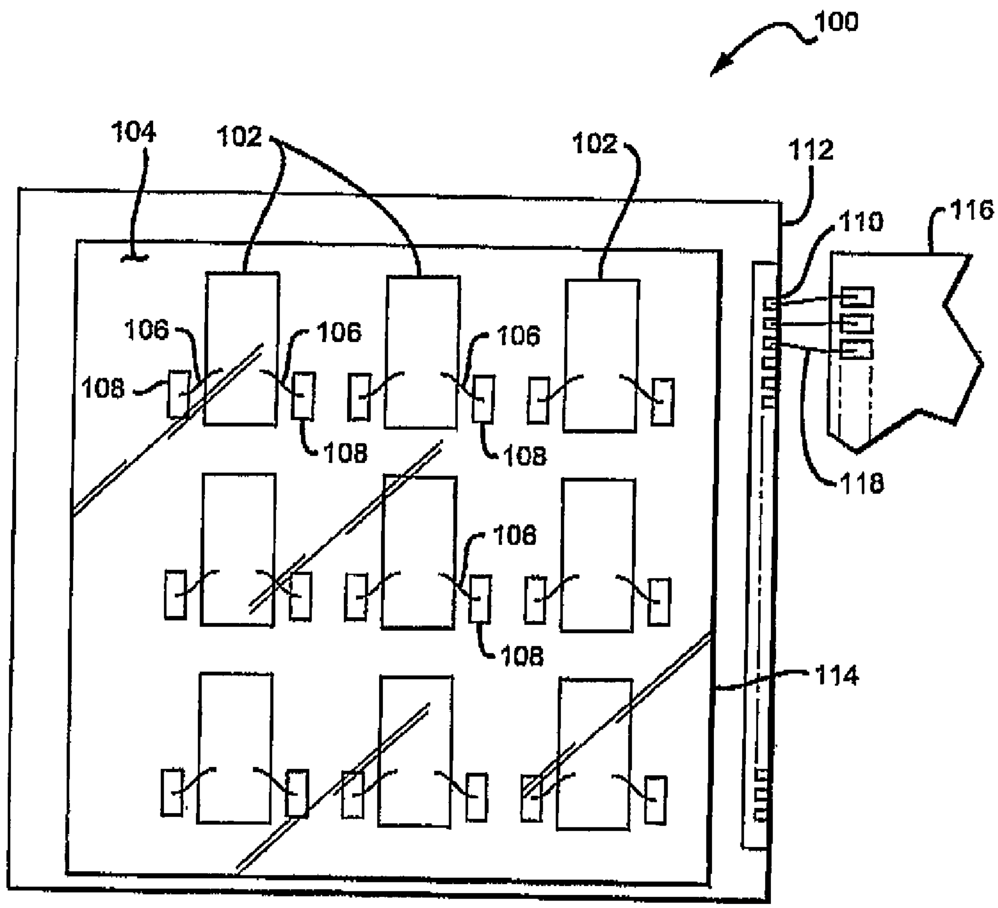
Figure 4:
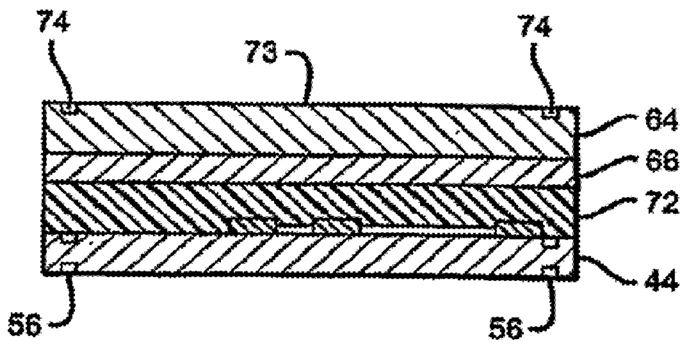
Figure 5:
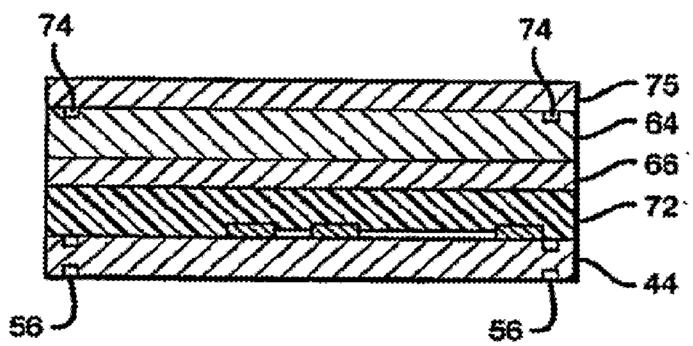
Figure 6:
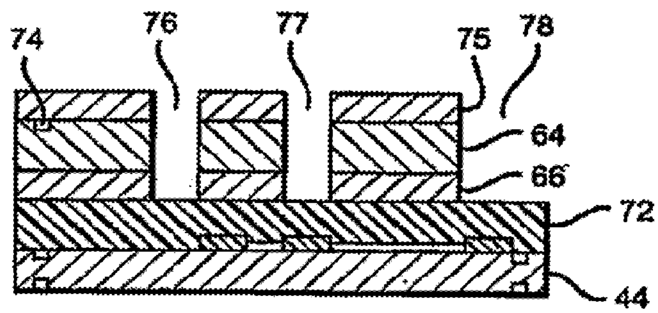
Figure 7:
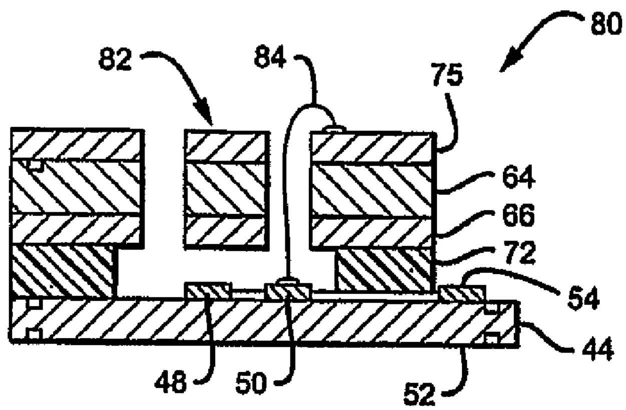
Figure 8:
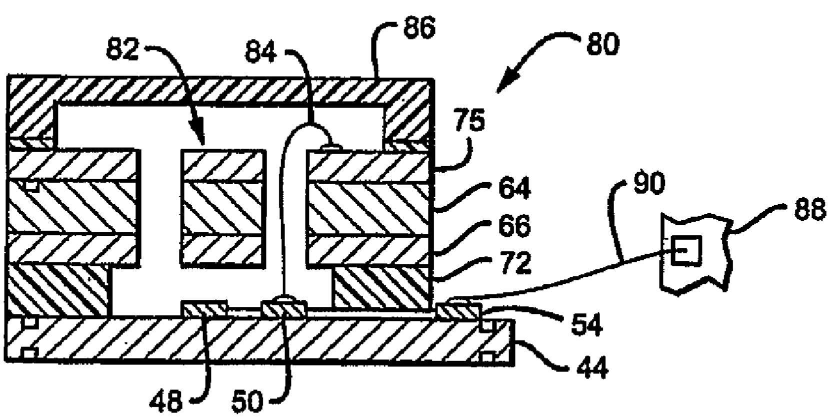
Figure 9:
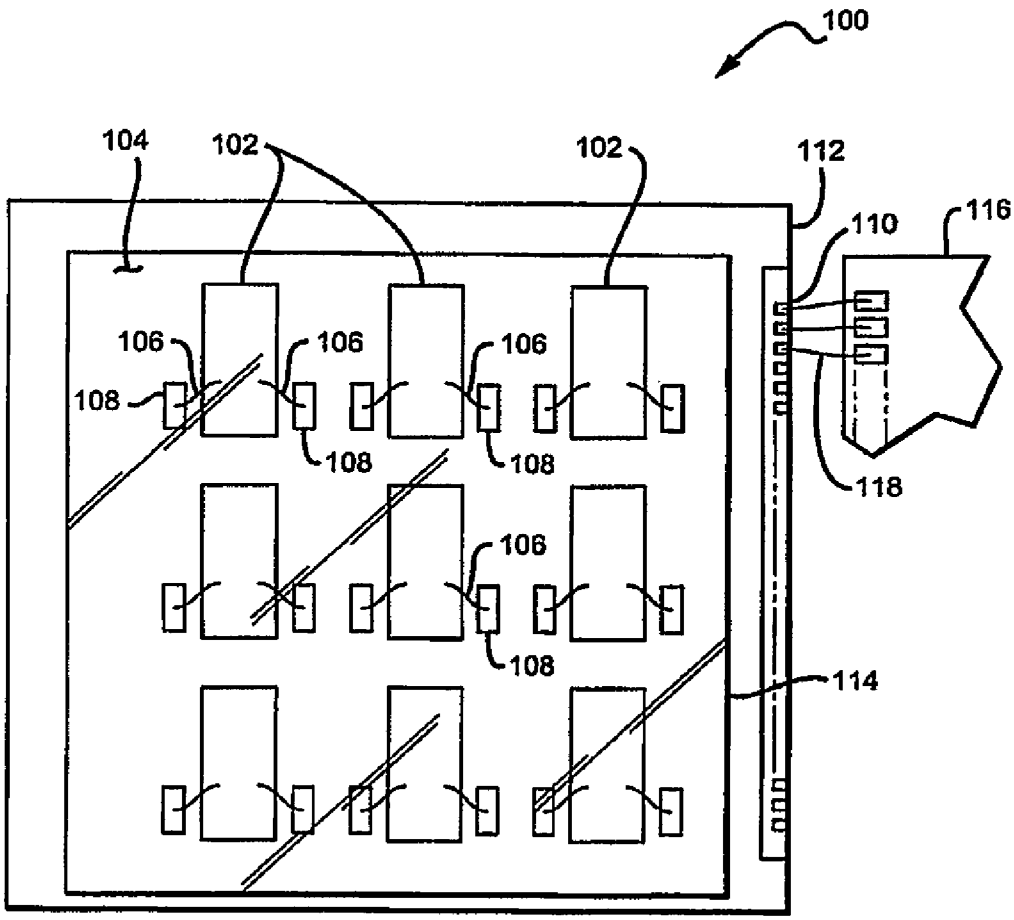

With reference now to FIG. 9, there is shown in schematic form an alternative embodiment of the invention comprising a module 100 incorporating multiple—in this case nine—MEMS devices 102 adhesively attached to a substrate 104 comprising, for example, a CMOS wafer which may have one or more regions on the upper surface with electronic circuitry patterned thereon. The MEMS devices 102 may all be of the same type or may comprise different types. In any case, wire bonds 106 (or alternatively, plated-through, conductive vias) connect the MEMS devices 102 to the electronic circuitry on the wafer by means of pads 108. The wafer circuitry is in turn connected to contacts 110 on an extension 112 of the wafer 104. A protective cover 114 overlies the MEMS devices 102. The module 100 may be coupled to a higher circuit assembly 116 by electrical conductors 118 connected to the contacts 110. The module 100 is fabricated using the process steps described in connection with FIGS. 2–8.

While several illustrative embodiments of the invention have been shown and described, numerous variations and alternative embodiments will occur to those skilled in the art. All such variations and alternative embodiments are contemplated, and can be made without departing from the spirit and scope of the invention as defined in the appended claims.

What is claimed is:

1. A MEMS module comprising:

at least one MEMS device including a movable element;

a substrate having a surface carrying electronic circuitry, the at least one MEMS device overlying at least a portion of the electronic circuitry;

an organic adhesive bond joining the at least one MEMS device and the circuitry-carrying surface of the substrate; and electrical conductors connecting the at least one MEMS device with the electronic circuitry.

2. The module of claim 1 in which:

the substrate includes an extension carrying electrical contacts connected to the electronic circuitry, the contacts being adapted to connect the module to a higher assembly.

3. The module of claim 1 in which:

the electrical conductors connecting the at least one MEMS device with the electronic circuitry comprises wire bonds.

4. The module of claim 1 in which:

the electrical conductors connecting the at least one MEMS device with the electronic circuitry comprises plated-through vias.

5. The module of claim 1 in which:

the electronic circuitry-carrying substrate comprises a CMOS die.

6. The module of claim 1 in which:

the module comprises a plurality of MEMS devices; and the electronic circuitry-carrying substrate comprises a CMOS wafer, the electronic circuitry comprising a plurality of electronic circuits.

7. The module of claim 1 in which:

the at least one MEMS device is formed on an SOI substrate.

8. The module of claim 1 in which:

the at least one MEMS device comprised at least one MEMS sensor and/or at least one MEMS actuator.

9. The module of claim 1 in which:

the at least one MEMS device is selected from the group consisting of an electrical switch, an electromechanical motor, an accelerometer, a capacitor, a pressure transducer, an electrical current sensor, a gyro and a magnetic sensor.

10. The module of claim 1 in which:

the organic adhesive bond comprises an epoxy.

11. The module of claim 1 in which:

the organic adhesive bond is selected from the group consisting of epoxy, polyimide, silicone, acrylic, polyurethane, polybenzimidazole, polyquinoraline and benzocyclobutene.

12. The module of claim 1 further comprising:

a cover enclosing the MEMS device.

13. The module of claim 1 in which:

the at least one MEMS device overlies the entire area occupied by the electronic circuitry.

* * * * *

UNITED STATES PATENT AND TRADEMARK OFFICE

CERTIFICATE OF CORRECTION

PATENT NO. : 6,979,872 B2 
APPLICATION NO. : 10/438512
DATED : December 27, 2005
INVENTOR(S) : Robert L. Borwick, III, Jeffrey F. DeNatale and Robert J. Anderson It is certified that error appears in the above-identified patent and that said Letters Patent is hereby corrected as shown below:

In column 8, line 13, change “comprised” to -- comprises --.

Title page should be deleted and substitute therefor the attached title page

In the Drawings:

Replace all drawings with the formal drawings Figs 1-9 as shown on the attached pages.

Signed and Sealed this

Thirteenth Day of February, 2007

JON W. DUDAS
*Director of the United States Patent and Trademark Office*

(12) United States Patent
Borwick, III et al.

(10) Patent No.: US 6,979,872 B2
(45) Date of Patent: Dec. 27, 2005

(54) MODULES INTEGRATING MEMS DEVICES WITH PRE-PROCESSED ELECTRONIC CIRCUITRY, AND METHODS FOR FABRICATING SUCH MODULES

(75) Inventors: Robert L. Borwick, III, Thousand Oaks, CA (US); Jeffrey F. DeNatale, Thousand Oaks, CA (US); Robert J. Anderson, Thousand Oaks, CA (US)

(73) Assignee: Rockwell Scientific Licensing, LLC, Thousand Oaks, CA (US)

(*) Notice: Subject to any disclaimer, the term of this patent is extended or adjusted under 35 U.S.C. 154(b) by 149 days.

(21) Appl. No.: 10/438,512

(22) Filed: May 13, 2003

(65) Prior Publication Data

US 2004/0227201 A1 Nov. 18, 2004

(51) Int. Cl.[7] .................................... H01L 29/84
(52) U.S. Cl. .................................... 257/415
(58) Field of Search .......................... 257/414, 415

(56) References Cited

U.S. PATENT DOCUMENTS

| | | | | |
|---|---|---|---|---|
| 4,874,499 | A * | 10/1989 | Smith et al. | 204/403.03 |
| 5,578,976 | A | 11/1996 | Yao | 333/262 |
| 5,880,921 | A | 3/1999 | Tham et al. | 361/233 |
| 5,959,516 | A | 9/1999 | Chang et al. | 334/14 |
| 6,074,890 | A | 6/2000 | Yao et al. | 438/52 |
| 6,159,385 | A | 12/2000 | Yao et al. | 216/2 |
| 6,188,322 | B1 | 2/2001 | Yao et al. | 340/664 |
| 6,199,874 | B1 | 3/2001 | Galvin et al. | 280/5.514 |
| 6,275,122 | B1 | 8/2001 | Speidell et al. | 333/186 |
| 6,277,666 | B1 | 8/2001 | Hays et al. | 438/50 |
| 6,348,788 | B1 | 2/2002 | Yao et al. | 324/99 R |
| 6,411,214 | B1 | 6/2002 | Yao et al. | 340/564 |
| 6,417,743 | B1 | 7/2002 | Mihailovich et al. | 333/24 C |
| 6,423,815 | B1 * | 7/2002 | Nakajima et al. | 528/288 |
| 2003/0174934 | A1 * | 9/2003 | Ishii et al. | 385/18 |
| 2004/0016995 | A1 * | 1/2004 | Kuo et al. | 257/678 |
| 2004/0063237 | A1 * | 4/2004 | Yun et al. | 438/48 |
| 2004/0076366 | A1 * | 4/2004 | Yun et al. | 385/18 |
| 2004/0112529 | A1 * | 6/2004 | Karlsson et al. | 156/306.6 |

OTHER PUBLICATIONS

M. Heschel et al., "Stacking Technology for A Space Constrained Microsystem", IEEE, 11th Annual International Workshop on Micro Electrical Mechanical Systems, Jan. 25-29, 1998, pp. 312-317.*

Merriam-Webster's Collegiate Dictionary, 10ed., 2001, pp. 817.*

* cited by examiner

*Primary Examiner*—W. David Coleman
(74) *Attorney, Agent, or Firm*—Koppel, Jacobs, Patrick & Heybl

(57) ABSTRACT

A MEMS module is provided comprising at least one MEMS device adhesively bonded to a substrate or wafer, such as a CMOS die, carrying pre-processed electronic circuitry. The at least one MEMS device, which may comprise a sensor or an actuator, may thus be integrated with related control, readout/signal conditioning, and/or signal processing circuitry.

An example of a method pursuant to the invention comprises the adhesive bonding of a pre-processed electronics substrate or wafer to a layered structure preferably in the form of a silicon-on-insulator (SOI) substrate. The SOI is then bulk micromachined to selectively remove portions thereof to define the MEMS device. Prior to release of the MEMS device, the device and the associated electronic circuitry are electrically interconnected, for example, by wire bonds or metallized vias.

13 Claims, 5 Drawing Sheets

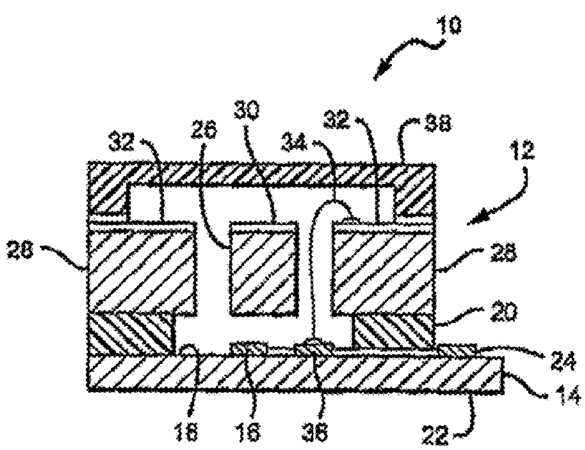

FIG. 1
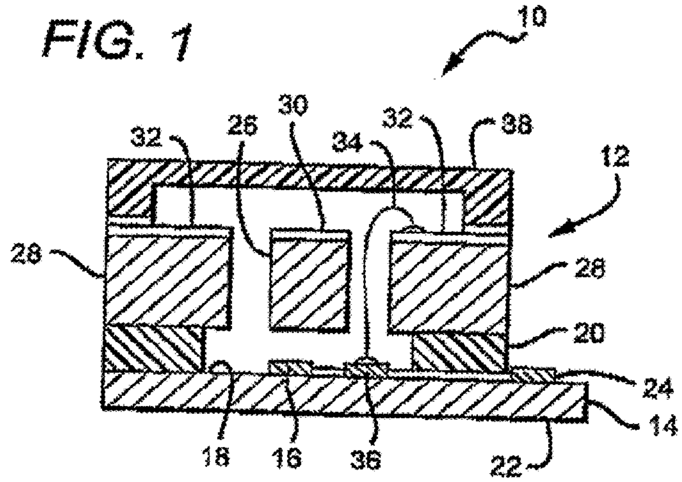
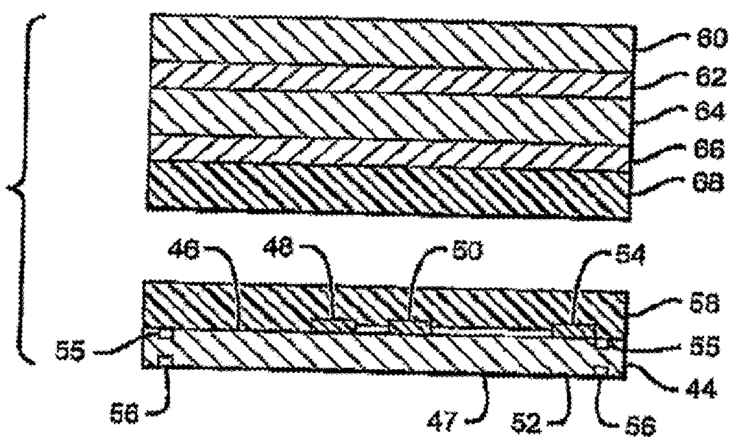
FIG. 2
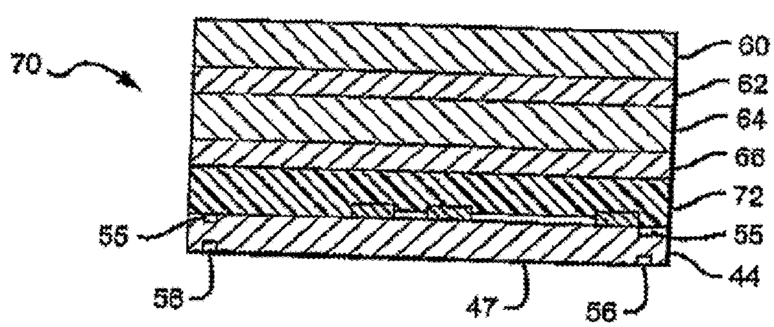
FIG. 3

UNITED STATES PATENT AND TRADEMARK OFFICE

CERTIFICATE OF CORRECTION

PATENT NO. : 6,979,872 B2
APPLICATION NO. : 10/438512
DATED : December 27, 2005
INVENTOR(S) : Robert L. Borwick, III et al.

It is certified that error appears in the above-identified patent and that said Letters Patent is hereby corrected as shown below:

The title page should be deleted and substitute therefore the attached title page.

Drawings:

Delete Drawings Fig. 1-9 and substitute therefore the Drawing Figs., 1-9, as shown on the attached Drawing sheets 1-4.

Column 8, line 13, change “comprised” to --comprises--.

Signed and Sealed this

Twenty-seventh Day of February, 2007

Jon W. Dudas

JON W. DUDAS
*Director of the United States Patent and Trademark Office*

(12) United States Patent
Borwick, III et al.

(10) Patent No.: US 6,979,872 B2
(45) Date of Patent: Dec. 27, 2005

(54) MODULES INTEGRATING MEMS DEVICES WITH PRE-PROCESSED ELECTRONIC CIRCUITRY, AND METHODS FOR FABRICATING SUCH MODULES

(75) Inventors: Robert L. Borwick, III, Thousand Oaks, CA (US); Jeffrey F. DeNatale, Thousand Oaks, CA (US); Robert J. Anderson, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 149 days.

(21) Appl. No.: 10/438,512

(22) Filed: May 13, 2003

(65) Prior Publication Data

US 2004/0227201 A1 Nov. 18, 2004

(51) Int. Cl.[7] .............................. H01L 29/84
(52) U.S. Cl. .............................. 257/415
(58) Field of Search .............................. 257/414, 415

(56) References Cited

U.S. PATENT DOCUMENTS

| | | | | |
|---|---|---|---|---|
| 4,874,499 | A * | 10/1989 | Smith et al. | 204/403.03 |
| 5,578,976 | A | 11/1996 | Yao | 333/262 |
| 5,880,921 | A | 3/1999 | Tham et al. | 361/233 |
| 5,959,516 | A | 9/1999 | Chang et al. | 334/14 |
| 6,074,890 | A | 6/2000 | Yao et al. | 438/52 |
| 6,159,385 | A | 12/2000 | Yao et al. | 216/2 |
| 6,188,322 | B1 | 2/2001 | Yao et al. | 340/664 |
| 6,199,874 | B1 | 3/2001 | Galvin et al. | 280/5.514 |
| 6,275,122 | B1 | 8/2001 | Speidell et al. | 333/186 |
| 6,277,666 | B1 | 8/2001 | Hays et al. | 438/50 |
| 6,348,788 | B1 | 2/2002 | Yao et al. | 324/99 R |
| [illegible] | [illegible] | [illegible] | [illegible] | 340/664 |
| 6,417,743 | B1 | 7/2002 | Mihailovich et al. | 333/24 C |
| 6,423,815 | B1 * | 7/2002 | Nakajima et al. | 528/288 |
| 2003/0174934 | A1 * | 9/2003 | Ishii et al. | 385/18 |
| 2004/0016995 | A1 * | 1/2004 | Kuo et al. | 257/678 |
| 2004/0063237 | A1 * | 4/2004 | Yun et al. | 438/48 |
| 2004/0076366 | A1 * | 4/2004 | Yun et al. | 385/18 |
| 2004/0112529 | A1 * | 6/2004 | Karlsson et al. | 156/306.6 |

OTHER PUBLICATIONS

M. Heschel et al., "Stacking Technology for A Space Constrained Microsystem", IEEE, 11th Annual International Workshop on Micro Electrical Mechanical Systems, Jan. 25-29, 1998, pp. 312-317.*

Merriam-Webster's Collegiate Dictionary, 10ed., 2001, pp. 817.*

* cited by examiner

*Primary Examiner*—W. David Coleman
(74) *Attorney, Agent, or Firm*—Koppel, Jacobs, Patrick & Heybl

(57) ABSTRACT

A MEMS module is provided comprising at least one MEMS device adhesively bonded to a substrate or wafer, such as a CMOS die, carrying pre-processed electronic circuitry. The at least one MEMS device, which may comprise a sensor or an actuator, may thus be integrated with related control, readout/signal conditioning, and/or signal processing circuitry.

An example of a method pursuant to the invention comprises the adhesive bonding of a pre-processed electronics substrate or wafer to a layered structure preferably in the form of a silicon-on-insulator (SOI) substrate. The SOI is then bulk micromachined to selectively remove portions thereof to define the MEMS device. Prior to release of the MEMS device, the device and the associated electronic circuitry are electrically interconnected, for example, by wire bonds or metallized vias.

13 Claims, 5 Drawing Sheets

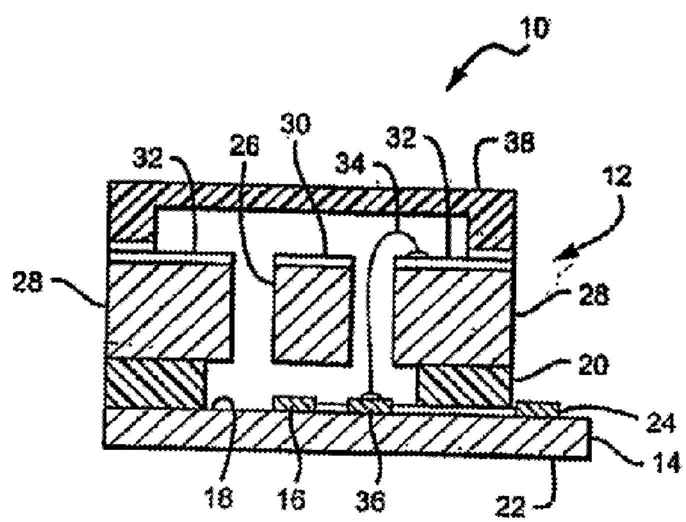

FIG. 1
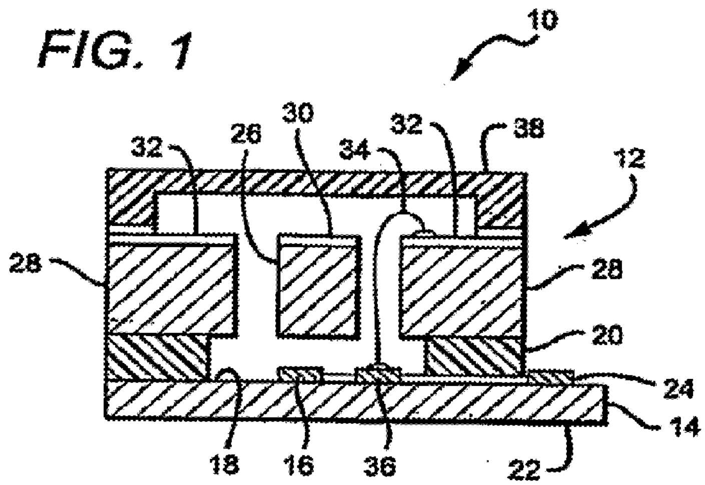
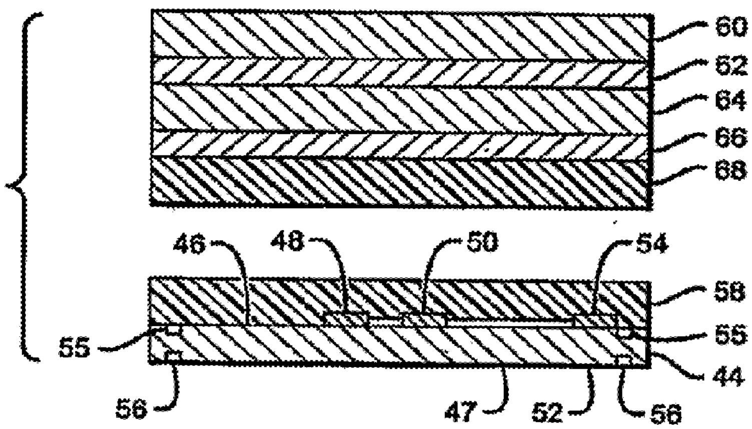
FIG. 2
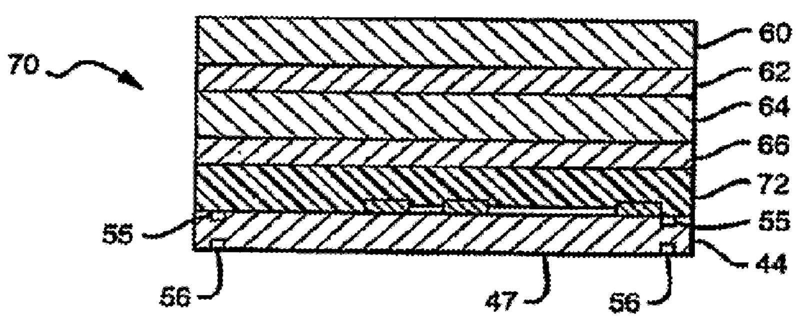
FIG. 3